(12) United States Patent
Kanematsu et al.

(10) Patent No.: US 8,611,129 B2
(45) Date of Patent: Dec. 17, 2013

(54) SEMICONDUCTOR DEVICE AND OPERATION METHOD THEREOF

(75) Inventors: Shigeru Kanematsu, Kanagawa (JP); Yuki Yanagisawa, Kanagawa (JP); Matsuo Iwasaki, Nagasaki (JP)

(73) Assignee: Sony Corporation, Tokyo (JP)

( * ) Notice: Subject to any disclaimer, the term of this patent is extended or adjusted under 35 U.S.C. 154(b) by 85 days.

(21) Appl. No.: 13/361,205

(22) Filed: Jan. 30, 2012

(65) Prior Publication Data
US 2012/0212991 A1  Aug. 23, 2012

(30) Foreign Application Priority Data
Feb. 21, 2011 (JP) .................................. 2011-034797

(51) Int. Cl.
   *G11C 17/00* (2006.01)
(52) U.S. Cl.
   USPC .......................... 365/103; 365/164; 365/225.7
(58) Field of Classification Search
   USPC ............... 365/103, 164, 225.7; 257/296, 298, 257/300, 312
   See application file for complete search history.

(56) References Cited

U.S. PATENT DOCUMENTS 7,161,218 B2 *  1/2007  Bertin et al. .................. 257/415
7,911,831 B2 *  3/2011  Rueckes et al. ............... 365/164

FOREIGN PATENT DOCUMENTS

JP        2006-510203       3/2006

* cited by examiner

*Primary Examiner* — Toan Le
(74) *Attorney, Agent, or Firm* — Dentons US LLP

(57) ABSTRACT

An operation method of a semiconductor device, includes providing one or more memory elements each including a first semiconductor layer of a first conductivity type, second and third semiconductor layers of a second conductivity type, which are disposed to be separated from each other in the first semiconductor layer, a first electrode electrically connected to the second semiconductor layer, and a second electrode electrically connected to the third semiconductor layer, and performing operation of writing information on a memory element to be driven of the one or more memory elements. The operation of writing is performed by forming a filament in a region between the second and third semiconductor layers, which is a conductive path electrically linking these semiconductor layers, through application of a voltage equal to or higher than a predetermined threshold between the first electrode and the second electrode.

13 Claims, 11 Drawing Sheets

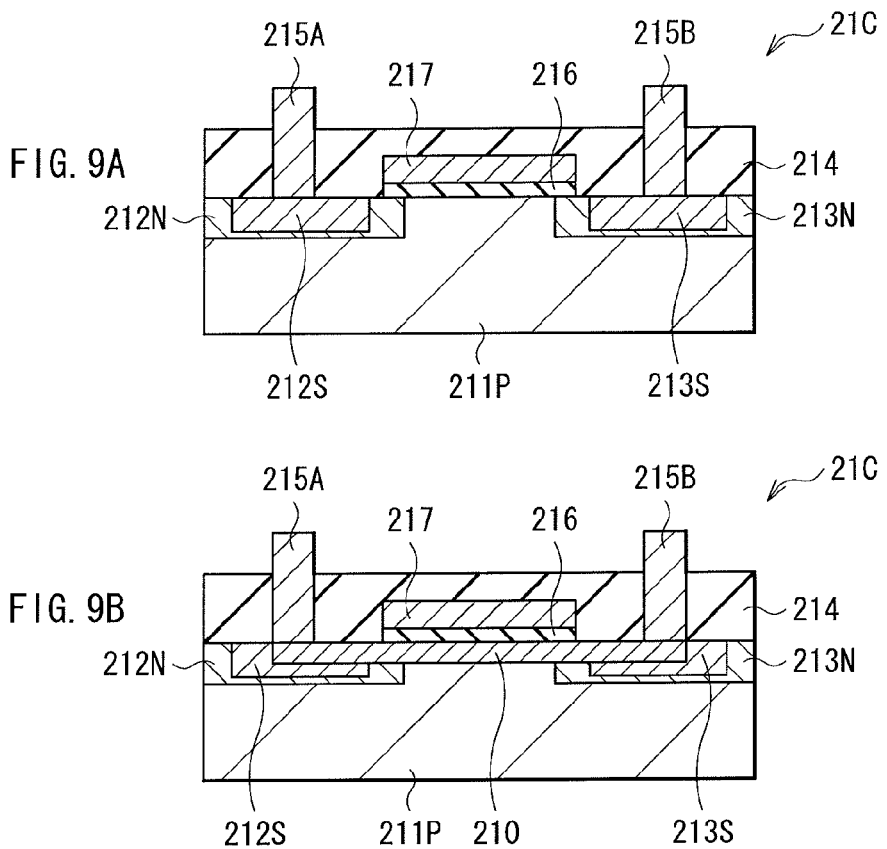
FIG. 9A
FIG. 9B
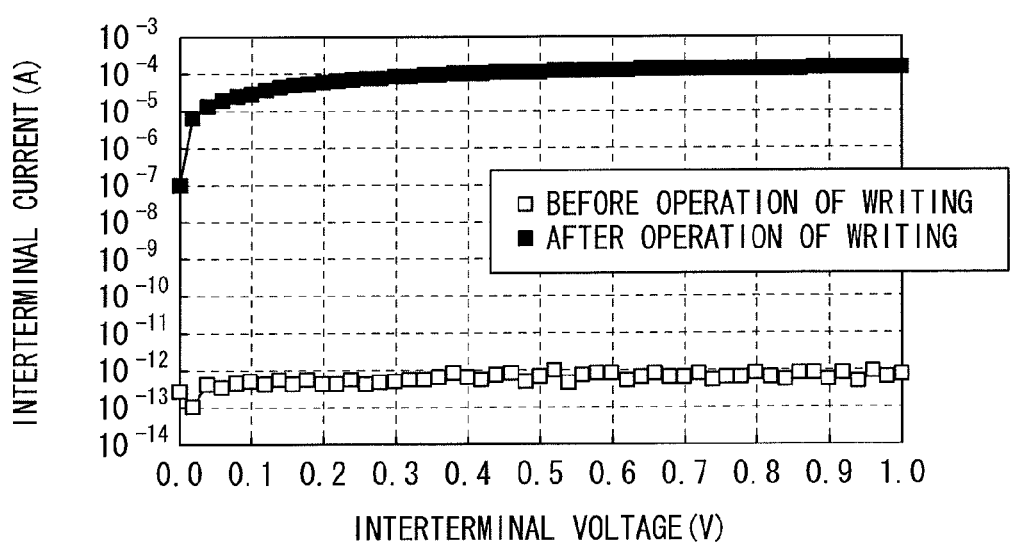
FIG. 10

SEMICONDUCTOR DEVICE AND OPERATION METHOD THEREOF

BACKGROUND

The present disclosure relates to a semiconductor device with a memory element suitable for serving as a One-Time Programmable (OTP) element, and an operation method of such a semiconductor device.

An OTP element is a nonvolatile memory element that may save information even when the power of a device is turned off, and some structures of, for example, fuse type, anti-fuse type, and the like have been suggested.

In a fuse type OTP element, for example, a resistor is fused by feeding a large current to a resistance element made of polycrystalline silicon or the like, a state between both electrodes is changed from a short (short-circuit) state to an open (open-circuit) state, and thereby information writing operation is performed. On the other hand, in an anti-fuse type OTP element, for example, a dielectric breakdown of a dielectric film is caused by application of a voltage equal to or higher than a dielectric voltage to a Metal Oxide Semiconductor (MOS) type capacitive element, and thereby a state between both electrodes is changed from a short state to an open state. In other words, in this anti-fuse type OTP element, information writing operation is performed by allowing the state between both electrodes to be changed from the short state to the open state.

Further, for example, Japanese Unexamined Patent Application Publication (Published Japanese Translation of PCT Application) No. JP2006-510203 proposes an anti-fuse type OTP element using a technique different from the one described above.

SUMMARY

The OTP element of Japanese Unexamined Patent Application Publication No. JP2006-510203 mentioned above uses a snapback phenomenon in a MOS transistor. This snapback phenomenon is a phenomenon in which when a transistor is caused to be in an ON state by applying a predetermined voltage (gate voltage) to a gate and then the gate voltage is lowered, strong pinch off is forcibly caused, and a large current flows between a source and a drain with a voltage lower than a withstand voltage of an ordinary MOS transistor. In the OTP element of Japanese Unexamined Patent Application Publication No. JP2006-510203, a PN junction is destroyed by a large current flowing at the time of this snapback phenomenon, and, as a result, a short is caused between the source and the drain. In other words, in a manner similar to the typical anti-fuse OTP element described above, information writing operation is performed by allowing the state between both electrodes to be changed from a short state to an open state between both electrodes in this OTP element as well.

Incidentally, in the typical fuse-type OTP element described above, it is desirable to feed a large current at the time of the writing operation for the purpose of fusing the resistor. Therefore, a transistor with a high current capability which allows the large current to flow and a wire which is wide enough to pass a large current are desired, thereby increasing the area of the whole circuit including a peripheral part for the writing operation. In addition, it is desirable that the OTP element itself be enlarged as compared to the element size of an ordinary transistor, which also leads to a disadvantage in terms of area when the bit count in a memory device is increased.

On the other hand, in the typical anti-fuse type OTP element described above, it is desirable to apply a high voltage in order to cause the dielectric breakdown of the dielectric film. The high voltage is on a level of exceeding the withstand voltage of an ordinary MOS transistor in which the dielectric film serves as a gate insulator and thus, it is desirable to provide a transistor of a higher withstand voltage in order to perform the writing operation for the OTP element. Therefore, still, an increase in the area of a memory device is caused, or an increase in the production process results.

In contrast, in the OTP element of Japanese Unexamined Patent Application Publication No. JP2006-510203 described above, since the PN junction is destroyed by the large current flowing at the time of the snapback phenomenon, the large current also flows through a transistor (selection transistor) to select the OTP element to be driven (targeted for the writing operation). Here, in this technique, as described earlier, the large current is made to flow by allowing a state in which the electric current flows through both of the OTP element and the selection transistor (the ON state) to be changed to a snapback mode by lowering the gate voltage of the OTP element. For this reason, there is such a concern that when the resistance value of the selection transistor at the time of the first ON state is large, the voltage between both ends of the OTP element falls due to a voltage drop. Therefore, in the selection transistor, it is desirable to lower the resistance value by, for example, setting a large width (gate width) of a channel region. This leads to an increase in the element size of the selection transistor.

In addition, this selection transistor is also used to select the OTP element targeted for reading at the time of operation of reading after the writing operation and thus, destruction of the selection transistor at the time of the writing operation is not acceptable. Therefore, the selection transistor is desired to have a current capability high enough to allow in the ON state a sufficient flow of an electric current flowing at the time of the writing operation, and it is desirable to make the element size of the selection transistor larger than the OTP element in this respect as well.

Because of these, in the OTP element of Japanese Unexamined Patent Application Publication No. JP2006-510203, although the OTP element may be made in substantially the same element size as an ordinary MOS transistor, the selection transistor used as being paired with the OTP element is of an element size larger than the OTP element. As a result, a memory cell (a so-called "1T1R" type memory cell) per bit as a whole leads to an increase in the element area.

In this way, in a semiconductor device with a typical memory element (OTP element), it has been difficult to reduce the area, and making a suggestion about a technique to improve this situation has been expected.

In view of the foregoing, it is desirable to provide a semiconductor device making it possible to reduce the area, and an operation method thereof.

According to an embodiment of the present disclosure, there is provided an operation method of a semiconductor device, the method including: providing one or more memory elements each including a first semiconductor layer of a first conductivity type, second and third semiconductor layers of a second conductivity type, which are disposed to be separated from each other in the first semiconductor layer, a first electrode electrically connected to the second semiconductor layer, and a second electrode electrically connected to the third semiconductor layer; and performing operation of writing information on a memory element to be driven of the one or more memory elements. The operation of writing is performed by forming a filament in a region between the second and third semiconductor layers, which is a conductive path electrically linking these semiconductor layers, through application of a voltage equal to or higher than a predetermined threshold between the first electrode and the second electrode.

In the operation method according to the above-described embodiment, the operation of writing is performed by forming the filament in the region between the second and third semiconductor layers, through the application of the voltage equal to or higher than the predetermined threshold between the first electrode and the second electrode, for the memory element to be driven, of the one or more memory elements. This realizes the operation of writing, without making the memory element be of a high withstand voltage, or causing a flow of a large current at the time of the operation of writing.

According to another embodiment of the present disclosure, there is provided a semiconductor device including one or more memory elements and a drive section. The one or more memory elements each include a first semiconductor layer of a first conductivity type, second and third semiconductor layers of a second conductivity type which are disposed to be separated from each other in the first semiconductor layer, a first electrode electrically connected to the second semiconductor layer, and a second electrode electrically connected to the third semiconductor layer. The drive section performs operation of writing information, by forming a filament in a region between the second and third semiconductor layers, which is a conductive path electrically linking these semiconductor layers, through application of a voltage equal to or higher than a predetermined threshold between the first electrode and the second electrode, in a memory element to be driven of the one or more memory elements.

In the semiconductor device according to the above-described embodiment, the operation of writing information is performed by forming the filament in the region between the second and third semiconductor layers, through the application of the voltage equal to or higher than the predetermined threshold between the first electrode and the second electrode, in the memory element to be driven, of the one or more memory elements. This realizes, in at least a partial memory element corresponding to the memory element after the operation of writing information, the operation of writing without making the memory element be of a high withstand voltage, or causing a flow of a large current at the time of the operation of writing.

According to the semiconductor device and the operation method of the above-described embodiments, the operation of writing information is performed by forming the filament in the region between the second and third semiconductor layers, through the application of the voltage equal to or higher than the predetermined threshold between the first electrode and the second electrode, for the memory element to be driven, of the one or more memory elements. Therefore, it is possible to realize the operation of writing, without making the memory element be of a high withstand voltage, or causing a flow of a large current at the time of the operation of writing. Accordingly, an area in the semiconductor device may be reduced.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 9A and 9B are schematic cross-sectional diagrams each illustrating another configurational example of the memory element (before and after operation of writing) illustrated in FIG. 7.

FIG. 10 is a characteristic diagram illustrating an electrical characteristic of a memory element (before and after operation of writing) according to an example of the second embodiment.

DETAILED DESCRIPTION OF EMBODIMENTS

Embodiments of the present disclosure will be described below in detail with reference to the drawings. Incidentally, the description will be provided in the following order.

1. First embodiment (an example in which no dielectric film and no conductive film are provided: NPN junction type structure)
2. Modification of the first embodiment
   Modification 1 (an example in which a silicide layer is provided)
3. Second embodiment (an example in which a dielectric film and a conductive film are provided: N-type MOS transistor structure)

4. Modifications of the second embodiment
Modification 2 (an example in which a memory element and a selection transistor are formed integrally)
Modification 3 (an example in which a control transistor for controlling a conductive film potential of a memory element is provided)
5. Other modifications (First Embodiment)

[Configuration of Memory Device 1]

Figure 1:
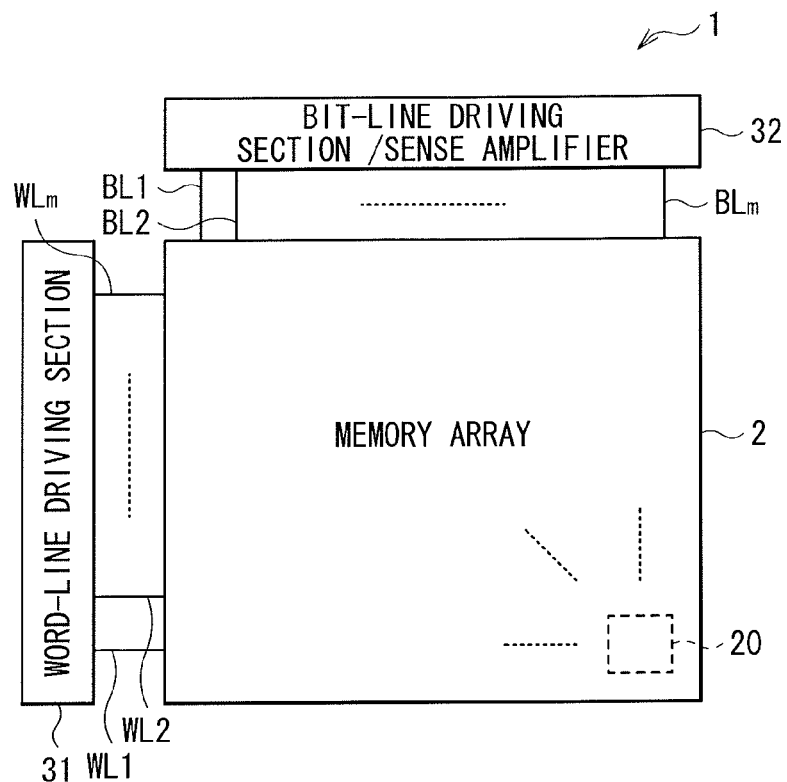
FIG. 1 is a block diagram illustrating a configurational example of a semiconductor device (a memory device) according to a first embodiment of the present disclosure.

FIG. 1 is a block diagram of a semiconductor device (a memory device 1) according to the first embodiment of the present disclosure. The memory device 1 is a memory device (a so-called OTP ROM (Read Only Memory)) in which information (data) may be written only once, and from which the written information may be read many times, but deletion of the information is disabled. This memory device 1 includes a memory array 2 having more than one memory cell 20, a word-line driving section 31, and a bit-line driving section/sense amplifier 32. Among these, the word-line driving section 31 and the bit-line driving section/sense amplifier 32 correspond to a specific example of "a drive section" (a writing operation section, a programming operation section) of the earlier-described embodiment in the present disclosure.

The word-line driving section 31 applies a predetermined electric potential (a word line potential to be described later) to two or more word lines WL1 to WLm (here, the number of the word lines is m (m: an integer not smaller than 2)) disposed in parallel in a row direction.

The bit-line driving section/sense amplifier 32 applies a predetermined electric potential (a voltage for operation of writing to be described later) to two or more bit lines BL1 to BLm disposed in parallel in a column direction (the number of the bit lines is m). Thus, a predetermined voltage V1 is applied to a memory element 21 to be described later in the memory cell 20, and thereby the operation of writing information which will be described later is performed. This bit-line driving section/sense amplifier 32 also has a function of performing operation of reading information from each of the memory cells 20 by using the above-mentioned m pieces of bit lines BL1 to BLm, as well as performing predetermined signal amplification processing in an internal sense amplifier. It is to be noted that in the following, the bit lines BL1 to BLm will be collectively referred to as a bit line BL as appropriate.

In this way, the word-line driving section 31 and the bit-line driving section/sense amplifier 32 select the memory cell 20 to be driven (targeted for operation) from the memory cells 20 in the memory array 2, and perform the operation of writing or reading information selectively.

[Configuration of Memory Array 2]

Figure 2:
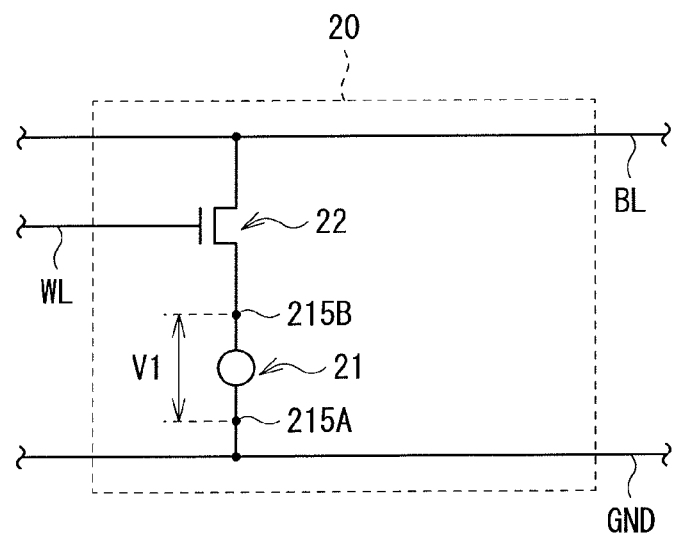
FIG. 2 is a circuit diagram illustrating a configurational example of a memory cell illustrated in FIG. 1.

In the memory array 2, the memory cells 20 are disposed in rows and columns (in the form of a matrix) as illustrated in FIG. 1. FIG. 2 illustrates an example of a circuit configuration of the memory cell 20. In this memory array 2, one word line WL and one bit line BL are connected for each of the memory cells 20.

Further, each of the memory cells 20 has one memory element 21 and one selection transistor 22, and is in a so-called "1T1R" type circuit configuration. In this memory cell 20, the word line WL is connected to a gate of the selection transistor 22. The bit line BL is connected to one of a source and a drain of the selection transistor 22, and to the other, one terminal (an electrode 215B to be described later) in the memory element 21 is connected. Furthermore, the other terminal (an electrode 215A to be described later) in the memory element 21 is connected to a ground (grounding) GND. In other words, in this memory cell 20, one memory element 21 and one selection transistor 22 are connected to each other in series between the bit line BL and the ground GND.

The selection transistor 22 is a transistor to select the memory element 21 to be driven (targeted for the operation of writing or targeted for the operation of reading), and is, for example, a MOS (Metal Oxide Semiconductor) transistor. However, the selection transistor 22 is not limited to this, and a transistor with other structure may be used.

[Memory Element 21]

Figure 3A:
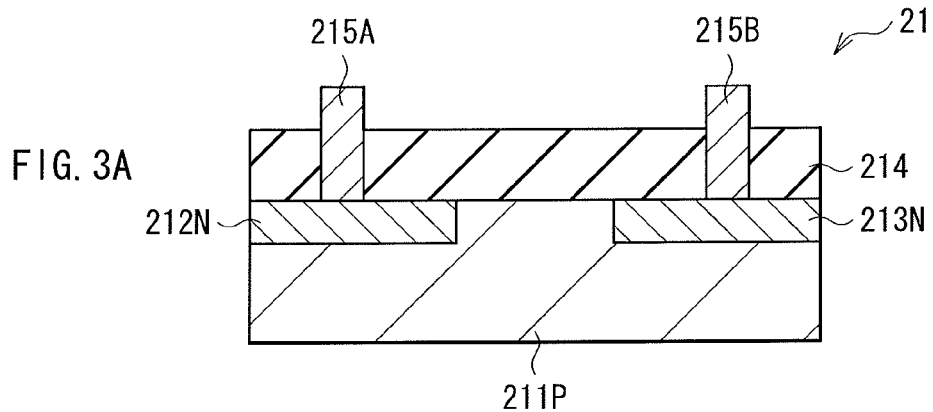
FIGS. 3A and 3B are schematic cross-sectional diagrams each illustrating a configurational example of the memory element (before and after operation of writing) illustrated in FIG. 2.
Figure 3B:
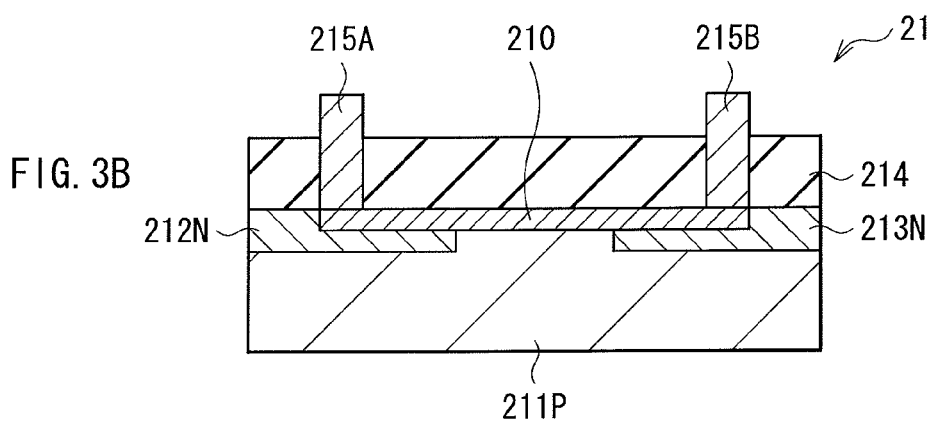

The memory element 21 is an element in which information is stored by the operation of writing to be described later, and is a so-called anti-fuse type OTP element which will be described later in detail. FIGS. 3A and 3B each schematically illustrate an example of a cross-sectional configuration of this memory element 21, and FIG. 3A illustrates the example of the cross-sectional configuration before the operation of writing to be described later, whereas FIG. 3B illustrates the example of the cross-sectional configuration after this operation of writing.

As illustrated in FIG. 3A, the memory element 21 before the operation of writing has a layered structure including semiconductor layers 211P, 212N, and 213N, the pair of electrodes 215A and 215B, and an insulating layer 214.

The semiconductor layer 211P (the first semiconductor layer) forms, for example, a semiconductor substrate, and is a P-type (the first conductivity type) semiconductor layer. This semiconductor layer 211P is made of, for example, a semiconductor material in which silicon (Si) is doped with an impurity such as boron (B).

The semiconductor layer 212N (the second semiconductor layer) and the semiconductor layer 213N (the third semiconductor layer) are disposed apart from each other with a predetermined gap therebetween in the semiconductor layer 211P, and are each formed of a N-type (the second conductivity type) semiconductor layer (form a so-called N+ layer). These semiconductor layers 212N and 213N are each made of a semiconductor material in which Si is doped with, for example, an impurity such as arsenic (As) or phosphorus (P), and each have a thickness of around 50 to 200 nm. Such semiconductor layers 212N and 213N may be easily formed in a region of the semiconductor layer 211P, by using a mask pattern such as a predetermined photoresist or oxide film. Here, it is desirable that the distance between these semiconductor layers 212N and 213N be as short as possible (for example, around 50 to 200 nm), because this makes it possible to realize the memory element 21 of a small element size.

The insulating layer 214 is provided to cover the semiconductor layers 211P, 212N, and 213N. This insulating layer 214 is made of, for example, an insulating material such as silicon oxide ($SiO_2$) or silicon nitride ($SiN_x$), and the thickness is around 50 to 1000 nm.

The electrode 215A (the first electrode) is provided in the insulating layer 214 to be electrically connected to the semiconductor layer 212N on the semiconductor layer 212N, and this makes it possible to apply a predetermined electric potential to the semiconductor layer 212N. Further, the electrode 215B (the second electrode) is provided in the insulating layer 214 to be electrically connected to the semiconductor layer 213N on the semiconductor layer 213N, and this makes it possible to apply a predetermined electric potential to the semiconductor layer 213N. These electrodes 215A and 215B are each made of, for example, a conductive material such as metal including tungsten (W), aluminum (Al), and the like.

On the other hand, as illustrated in FIG. 3B, in the memory element 21 after the operation of writing, a filament 210 (a conductive route section) to be described below is formed, in addition to the semiconductor layers 211P, 212N, and 213N, the electrodes 215A and 215B, and the insulating layer 214 described above.

This filament 210 is formed in a region between the semiconductor layers 212N and 213N via the semiconductor layer 211P, and although details will be described later, the filament 210 functions as a conductive path (a conductive route) connecting these semiconductor layers 212N and 213N (the electrodes 215A and 215B) to each other electrically. In other words, in the memory element 21 illustrated in this FIG. 3B, a short is caused between the semiconductor layers 212N and 213N (in a short state) with a predetermined resistance value (by a resistance component), by the filament 210. Such a filament 210 is formed by movement of one or both of the conductive component of the electrode 215A and the conductive component of the electrode 215B by migration when the voltage V1 equal to or higher than a predetermined threshold is applied between the electrodes 215A and 215B (see FIG. 2). It is to be noted that the principle of the formation of this filament 210 will be described later in detail.

Incidentally, the structure of the memory element 21 illustrated in FIG. 3A may be easily formed by using a technique similar to a process of forming a typical MOS transistor (for example, a process of forming self-aligning source/drain through use of a gate of a MOS transistor as a mask). In that case, the formation may be achieved with a narrow distance between the semiconductor layers 212N and 213N separated from each other, and also with excellent controllability of dimensions.

[Operation and Effects of Memory Device 1]
[1. Basic Operation]

In this memory device 1, as illustrated in FIG. 1 and FIG. 2, the word-line driving section 31 applies the predetermined electric potential (the word line potential) to the m pieces of word lines WL1 to WLm. Further, in conjunction with that, the bit-line driving section/sense amplifier 32 applies the predetermined electric potential (the voltage for the operation of writing) to the m pieces of bit lines BL1 to BLm. As a result, the memory cell 20 to be driven (targeted for the operation of writing) is selected from the memory cells 20 in the memory array 2, and the predetermined voltage V1 to be described later is applied to the memory element 21 therein, and the operation of writing information (only once) is performed selectively.

On the other hand, the bit-line driving section/sense amplifier 32 performs the operation of reading information from the memory element 21 in the memory cell 20 to be driven (targeted for the operation of reading) by using the m pieces of bit lines BL1 to BLm, and also carries out the predetermined signal amplification processing in the internal sense amplifier. Thus, the operation of reading the information from the memory element 21 is performed selectively.

Here, when the memory cell 20 (the memory element 21) to be driven (targeted for the operation of writing or targeted for the operation of reading) is selected, the predetermined electric potential (the word line potential) is applied to the word line WL connected to the memory cell 20, and also, the predetermined voltage (the voltage for the operation of writing) is applied to the connected bit line BL. Meanwhile, in the memory cell 20 other than the memory cell 20 to be driven, a ground potential (for example, 0 V) is applied to the connected word line WL, and also, the connected bit line BL is set in a floating state or at the ground potential (0 V). In this way, the operation of writing or the operation of reading is performed after the memory element 21 to be driven is selected by causing the selection transistor 22 in the memory cell 20 to be driven to be in the ON state.

[2. Details of Operation of Writing]

Next, with reference to FIG. 3A to FIG. 5, the operation of writing in the memory device 1, which is one of characteristics of the present disclosure, will be described in detail in comparison with a comparative example.

[2-1. Comparative Example]

Figure 4:
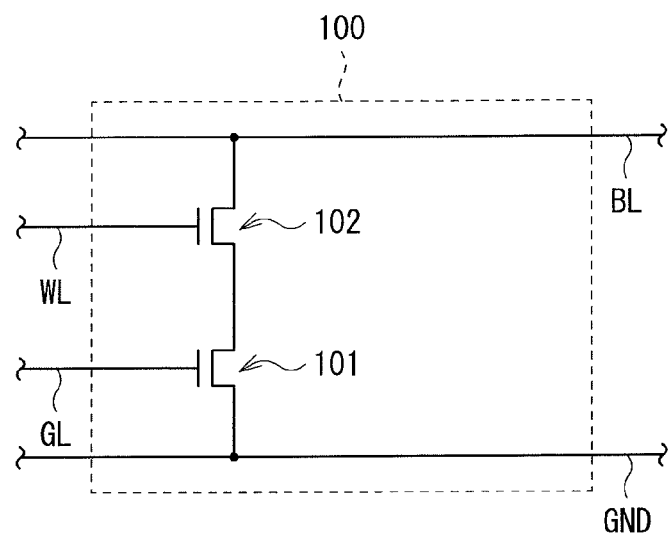
FIG. 4 is a circuit diagram illustrating a configuration of a memory cell in a memory device according to a comparative example.

FIG. 4 illustrates a circuit configuration of a memory cell (a memory cell 100) in a memory device according to the comparative example. The memory cell 100 of this comparative example has one memory element 101 (an OTP element) configured by using a transistor and one selection transistor 102. In this memory cell 100, a word line WL is connected to a gate of the selection transistor 102. A bit line BL is connected to one of a source and a drain in the selection transistor 102, and connected to the other is one of a source and a drain in the memory element 101. Further, in the memory element 101, a ground GND is connected to the other of the source and the drain, and a gate is connected to a gate line GL to which a predetermined gate voltage Vg is to be applied.

In this memory cell 100, operation of writing information into the memory element 101 is performed using a snapback phenomenon in a MOS transistor. This snapback phenomenon is a phenomenon in which when a transistor is turned to be in an ON state by application of a predetermined voltage (a gate voltage) to a gate and then the gate voltage is lowered, strong pinch off is forcibly caused, and a large current flows between a source and a drain with a voltage lower than the withstand voltage of an ordinary MOS transistor.

Figure 5:
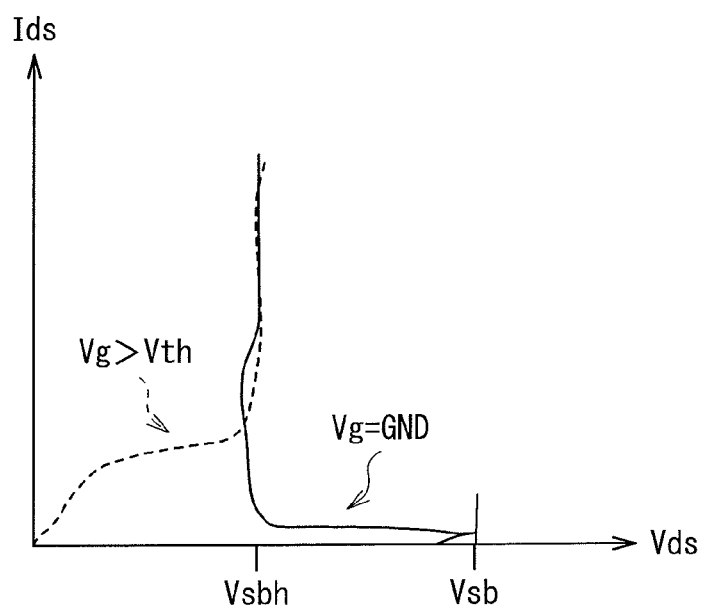
FIG. 5 is a characteristic diagram for explaining a writing method in the memory cell illustrated in FIG. 4.

In the operation of writing to this memory element 101, first, a voltage equal to or higher than a predetermined threshold voltage Vth is applied to the gate of each of the memory element 101 and the selection transistor 102, which are then both set to be in an ON state (gate voltage Vg of memory element 101>Vth: see FIG. 5). Subsequently, a voltage not exceeding the withstand voltage of each of the memory element 101 and the selection transistor 102 is applied to the bit line BL, thereby setting a state in which an electric current flows to each of the memory element 101 and the selection transistor 102. Subsequently, the gate voltage Vg of the memory element 101 is lowered (to, for example, Vg=electric potential of ground GND: see FIG. 5), setting the memory element 101 in a snapback mode. This causes a flow of a large current between the source and the drain of the memory element 101 as described above, and thereby a PN junction is destroyed, resulting in a short between the source and the drain (short-circuited). In other words, in this memory element 101, in a manner similar to a typical anti-fuse type OTP element, a state between both electrodes (the source and the drain) from an open state to a short state, and thereby the operation of writing information is performed.

However, in the operation of writing in this comparative example, the large current flowing at the time of the snapback phenomenon destroys the PN junction and thus, the large current also flows into the selection transistor 102. Here, in this technique as described above, a shift from the state (the ON state) in which the electric current flows in both of the memory element 101 and the selection transistor 102 to the snapback mode is caused by reducing the gate voltage Vg of the memory element 101, and thereby the large current is caused to flow. For this reason, there is a concern that when a resistance value of the selection transistor 102 in the first ON state is large, the voltage between both ends (the source and the drain) of the memory element 101 falls due to a voltage drop. Therefore, in the selection transistor 102, it is desirable to lower the resistance value by, for example, setting a large width (gate width) of a channel region. This leads to an increase in the element size of the selection transistor 102.

In addition, this selection transistor 102 is also used to select the memory element 101 targeted for reading at the time of the operation of reading after the operation of writing and thus, destruction of the selection transistor 102 at the time of the operation of writing is not acceptable. Therefore, in the selection transistor 102, a current capability high enough to pass an electric current flowing at the time of the operation of writing in the ON state is desired, and this also makes it preferable to render the element size of the selection transistor 102 larger than the memory element 101.

Therefore, in the memory element 101 of the comparative example, although it is possible to form the memory element 101 of substantially the same element size as an ordinary MOS transistor, the selection transistor 102 to be used as being paired with this memory element 101 is of an element size larger than the memory element 101. As a result, the memory cell 100 per bit as a whole leads to an increase in element area.

In this way, in the technique of the operation of writing in the typical OTP element including the memory element 101 of this comparative example, it is difficult to reduce the area of the memory device (semiconductor device).

[2-2. Operation of Writing in Embodiment]

In contrast, in the memory device 1 of the present embodiment, the operation of writing information to the memory element 21 in the memory cell 20 is performed in the word-line driving section 31 and the bit-line driving section/sense amplifier 32, as illustrated in FIG. 2, FIG. 3A, and FIG. 3B.

In other words, the word-line driving section 31 and the bit-line driving section/sense amplifier 32 apply the voltage V1 equal to or higher than the predetermined threshold, between the electrodes 215A and 215B, for the memory element 21 to be driven among the memory elements 21 in the memory array 2. Here, the voltage of this predetermined threshold is a voltage by which the filament 210 described above is formed in the memory element 21, and is, for example, around 3 to 20V. As a result, as illustrated in FIG. 3B, in the memory element 21 targeted for the operation of writing, between the semiconductor layers 212N and 213N, the filament 210 which is a conductive path electrically linking those semiconductor layers (the electrodes 215A and 215B) is formed.

Here, this filament 210 is assumed to be formed on the following principle. That is, first, when the voltage V1 mentioned above is applied between the electrodes 215A and 215B of the memory element 21, in a manner similar to a phenomenon of an isolation withstand voltage between a collector and an emitter which occurs in a typical bipolar transistor, a breakdown of the semiconductor layers 212N and 213N occurs, and thereby an electric current flows therebetween. Then, one or both of the conductive component of the electrode 215A and the conductive component of the electrode 215B are moved into the semiconductor layer 211P, by migration due to heat resulting from the electric current flowing at the time, and it is conceivable that this may result in the formation of the filament 210.

In this way, in the memory device 1 of the present embodiment, the memory element 21 in which the above-described operation of writing is not performed (information is not written) is open (in an open state) in which the semiconductor layers 212N and 213N are electrically separated from each other, as illustrated in FIG. 3A. On the other hand, the memory element 21 after the above-described operation of writing is performed (information is written) is in a state (a short state) in which the semiconductor layers 212N and 213N are electrically connected to each other with a resistance component by the formation of the filament 210, as illustrated in FIG. 3B. In other words, the memory element 21 may be caused to function as an anti-fuse type OTP element.

It is to be noted that in "the open state" before the above-described operation of writing, actually, a fine leakage current flows and thus, strictly speaking, a complete open state is not established. However, between the state before the operation of writing (before the filament 210 is formed) and the state after the operation of writing (after the filament 210 is formed), a difference in electric current flowing between the semiconductor layers 212N and 213N is large and thus, these states before and after the operation of writing may be detected by being distinguished from each other.

In such operation of writing in the present embodiment, unlike the technique in the typical OTP element including the above-described comparative example, the operation of writing is realized without allowing the memory element to have a high withstand voltage or causing a flow of a large current at the time of the operation of writing. This will be described below in detail.

First, at the time of this operation of writing, after a predetermined word potential is applied to the gate of the selection transistor 22 thereby making the selection transistor 22 be in the ON state as described above, a voltage equal to or higher than a predetermined value (the voltage for the operation of writing) is applied to the bit line BL. At this moment, although the selection transistor 22 is in the ON state, only an electric current on the same level as a leakage current flows, and thus, it is possible to virtually ignore a voltage drop in the selection transistor 22. For this reason, a potential difference (voltage) between the voltage applied to the bit line BL and the electric potential of the ground GND (ground potential) is applied approximately as it is between both ends (between the electrodes 215A and 215B) of the memory element 21. Subsequently, by setting the voltage to be applied to the bit line BL at a voltage equal to or higher than the voltage (the above-mentioned threshold voltage) at which a breakdown of the memory element 21 occurs and the filament 210 is formed by a momentary large current flowing at the time, the operation of writing to the memory element 21 is realized. In this way, in the memory element 21 of the present embodiment, since it is possible to realize an OTP element having a small element area on the same level as a typical MOS transistor, an OTP element having a small area as compared with a typical OTP element may be realized, which is advantageous particularly when the bit count is large. In addition, the memory element 21 is formed within a process range of a typical CMOS (Complementary Metal Oxide Semiconductor) process and thus, it is also advantageous in terms of wafer cost to a great extent.

Further, in order to cause a breakdown between the semiconductor layers 212N and 213N in the memory element 21, it is desirable to apply a voltage equal to a higher than the withstand voltage of a MOS transistor in the same generation to the bit line BL. Therefore, when the memory element 21 reaches a state (short state) of being short-circuited with a resistance component by the operation of writing, a potential difference occurs between the source and the drain of the selection transistor 22. Then, there is a concern that, due to this potential difference (voltage), a breakdown similar to that of the memory element 21 may also occur in the selection transistor 22, destroying the selection transistor 22. However, at the time of the operation of writing in the present embodiment, the selection transistor 22 is in the ON state and thus, the voltage applied to the bit line BL is distributed by a resistance value of this selection transistor 22 and a resistance value of the memory element 21. In other words, as a result, the voltage applied between the source and the drain of the selection transistor 22 tends to be lower than the voltage applied at the time of the operation of writing into the memory element 21. For this reason, by appropriately setting the voltage applied to the bit line BL at the time of the operation of writing, the operation of writing to the memory element 21 may be performed without causing the destruction of the selection transistor 22. Thus, the selection transistor 22 may not be formed to have a high withstand voltage and therefore, a production process for such a high withstand voltage may not be added, and it is also advantageous in terms of wafer cost to a great extent.

As described above, in the present embodiment, in the word-line driving section 31 and the bit-line driving section/sense amplifier 32, the voltage V1 equal to or higher than the predetermined threshold is applied between the electrodes 215A and 215B, for the memory element 21 to be driven among the memory elements 21 in the memory array 2, which forms the filament 210 in the region between the semiconductor layers 212N and 213N, and thereby the operation of writing information is performed. This makes it possible to realize the operation of writing, without allowing the memory element 21 to have a high withstand voltage or causing a flow of a large current at the time of the operation of writing. Therefore, the area in the memory device 1 (the semiconductor device) may be decreased and also, production cost may be reduced.

(Modification of First Embodiment)

Next, a modification (a modification 1) of the first embodiment will be described. It is to be noted that the same elements as those in the first embodiment will be provided with the same reference characters as those in the first embodiment, and the description will be omitted as appropriate.

[Modification 1]

Figure 6A:
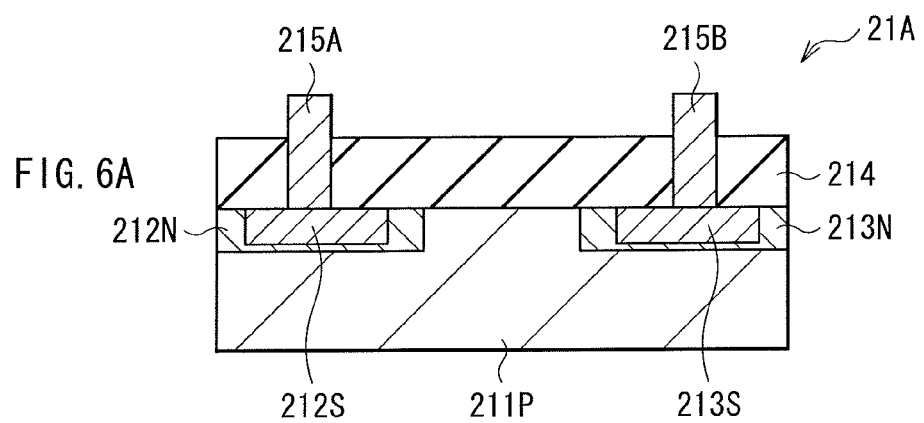
FIGS. 6A and 6B are schematic cross-sectional diagrams each illustrating a configurational example of a memory element (before and after operation of writing) according to a modification 1.
Figure 6B:
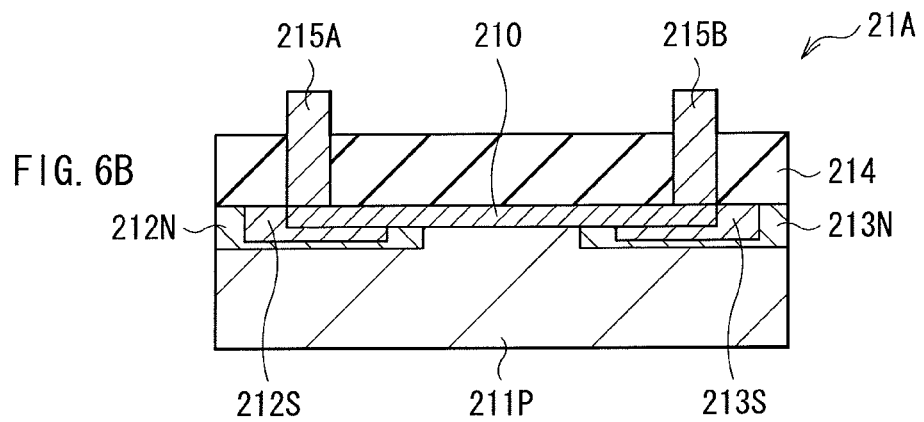

FIGS. 6A and 6B each schematically illustrate an example of a cross-sectional configuration of a memory element (a memory element 21A) according to the modification 1, and illustrate the example of the cross-sectional configuration before operation of writing and the example of the cross-sectional configuration after the operation of writing, respectively. The memory element 21A of the present modification is formed by providing silicide layers 212S and 213S within the semiconductor layers 212N and 213N, respectively, in the memory element 21 of the first embodiment illustrated in FIGS. 3A and 3B, and is otherwise similar in configuration to the memory element 21.

The silicide layer 212S is provided in a semiconductor layer 212N, and the silicide layer 213S is provided in a semiconductor layer 213N. These silicide layers 212S and 213S may be each made of, for example, silicide metal such as CoSi and NiSi (silicide using refractory metal), and may be formed using a typical silicide forming process.

In the present modification, basically, it is possible to obtain similar effects by similar operation to those of the first embodiment described above. However, in the present modification, one or more of a conductive component of an electrode 215A, a conductive component of an electrode 215B, and a conductive component of the silicide layers 212S and 213S move into a semiconductor layer 211P due to migration, and thereby a filament 210 is formed.

(Second Embodiment)

Next, the second embodiment of the present disclosure will be described. It is to be noted that the same elements as those in the first embodiment will be provided with the same reference characters as those in the first embodiment, and the description will be omitted as appropriate. In the first embodiment and the modification 1 described above, the memory element is in an NPN junction type structure, but in the present embodiment, a memory element in an N-type MOS transistor structure is used as will be described below.

Figure 7:
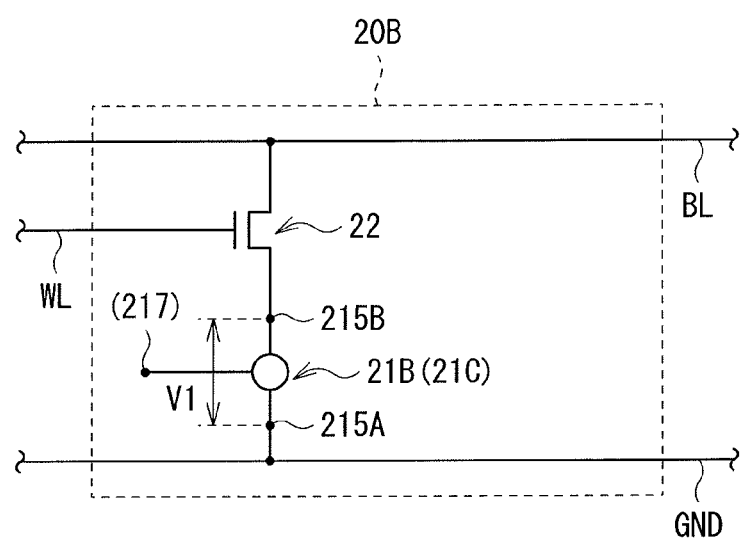
FIG. 7 is a circuit diagram illustrating a configurational example of a memory cell according to a second embodiment.

FIG. 7 illustrates an example of a circuit configuration of a memory cell (a memory cell 20B) according to the second embodiment. The memory cell 20B of the present embodiment has one memory element 21B (or memory element 21C) and one selection transistor 22. In other words, the memory cell 20B is equivalent to the memory cell 20 in the first embodiment when the memory element 21B or the memory element 21C to be described below is provided in place of the memory element 21.

In this memory cell 20B, a word line WL is connected to a gate of the selection transistor 22. A bit line BL is connected to one of a source and a drain in the selection transistor 22, and an electrode 215B in the memory element 21B (or the memory element 21C) is connected to the other. Further, an electrode 215A in the memory element 21B (or the memory element 21C) is connected to a grand GND, and a conductive film 217 to be described later is in a floating state (an unconnected state) electrically.

[Memory Element 21B]

Figure 8A:
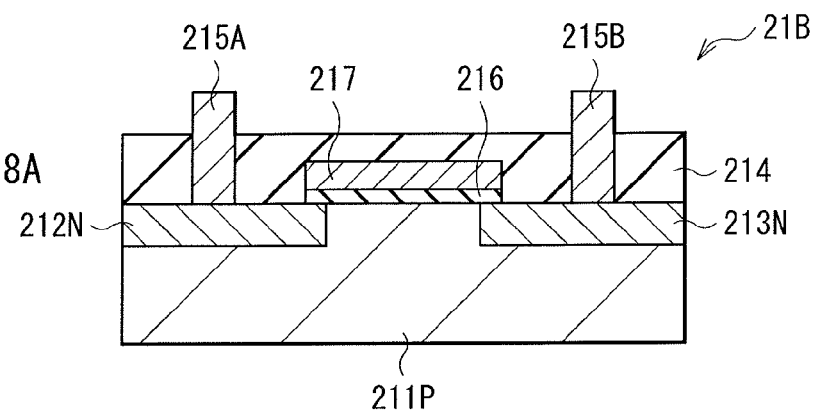
FIGS. 8A and 8B are schematic cross-sectional diagrams each illustrating a configurational example of a memory element (before and after operation of writing) illustrated in FIG. 7.
Figure 8B:
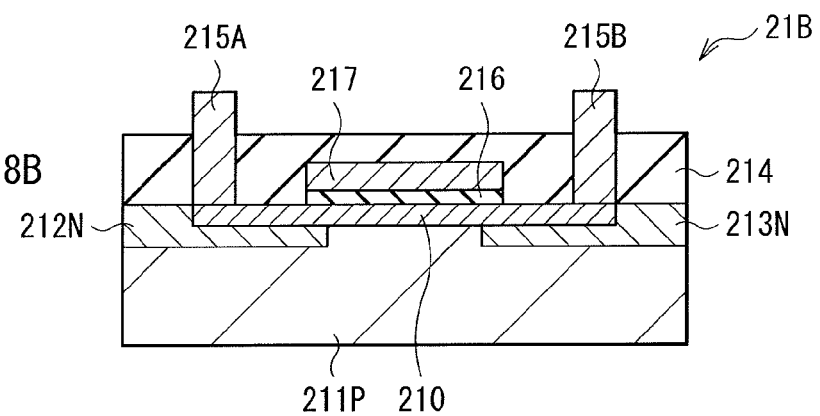

FIGS. 8A and 8B each schematically illustrate an example of a cross-sectional configuration of the memory element 21B of the present embodiment, and illustrate the example of the cross-sectional configuration before operation of writing and the example of the cross-sectional configuration after the operation of writing, respectively. This memory element 21B is formed by providing a dielectric film 216 and the conductive film 217 in this order in a region corresponding to a part between the semiconductor layers 212N and 213N in the memory element 21 of the first embodiment illustrated in FIGS. 3A and 3B, and is otherwise similar in configuration to the memory element 21. Specifically, here, the dielectric layer 216 and the conductive film 217 are provided in a region between the semiconductor layers 212N and 213N, and a partial region in these semiconductor layers 212N and 213N.

The dielectric film 216 is provided in a region corresponding to a part between the semiconductor layers 212N and 213N, on the semiconductor layer 211P, as described above. This dielectric film 216 is made of, for example, an insulating material (a dielectric) such as $SiO_2$, and the thickness is around a few to 20 nm.

The conductive film 217 is provided on a region where the dielectric film 216 is formed, and this forms a layered structure including the dielectric film 216 on a lower-layer side and the conductive film 217 on an upper-layer side. This conductive film 217 is made of, for example, a conductive material such as polycrystalline silicon or silicide metal, and the thickness is around 50 to 500 nm. It is to be noted that the conductive film 217 is in a floating state as described earlier and thus, an electrode to apply an electric potential to this conductive film 217 may not be provided. Further, here, the gate length of the memory element 21B defines the distance between the semiconductor layers 212N and 213N separated from each other, but this gate length may not be set at a minimum value (a value determined by a rating and the like) as a MOS transistor. In other words, as long as the semiconductor layers 212N and 213N are separated from each other, formation may not be based on the gate length minimum as a MOS transistor or less.

[Memory Element 21C]

FIGS. 9A and 9B each schematically illustrate an example of a cross-sectional configuration of the memory element 21C of the present embodiment, and illustrate the example of the cross-sectional configuration before the operation of writing and the example of the cross-sectional configuration after the operation of writing, respectively. This memory element 21C is formed by providing silicide layers 212S and 213S within the semiconductor layers 212N and 213N, respectively, in the memory element 21B illustrated in FIGS. 8A and 8B described above, like the modification 1 described earlier, and is otherwise similar in configuration to the memory element 21B.

In the present embodiment, the operation of writing is performed by setting the conductive film 217 in the memory element 21B or 21C targeted for the operation of writing in a no-voltage-applied state (a floating state), and applying a voltage V1 between the semiconductor layers 212N and 213N (between the electrodes 215A and 215B) like the first embodiment. As a result, by operation similar to that in the first embodiment, a filament 210 may be formed in the region between the semiconductor layers 212N and 213N, and similar effects may be obtained.

It is to be noted that in the present embodiment, it is desirable that the width (the length in a direction straddling the semiconductor layers 212N and 213N) of the conductive film 217, corresponding to the gate of the MOS transistor in the memory element 21B or 21C, be smaller than a gate length L of the selection transistor 22 formed of the MOS transistor. The reason for this is that this makes it possible to put the isolation withstand voltage between the semiconductor layers 212N and 213N in a downward direction, and as a result, it is possible to suppress the voltage in the operation of writing into the memory element 21B or 21C to a low level, and also to make the formation of the filament 210 easy.

[Example]

Here, there will be described an example of a memory device using the memory element 21C of the present embodiment, with reference to FIG. 10 to FIG. 12.

First, FIG. 10 illustrates an example of an electrical characteristic (a characteristic indicating a relationship between interterminal current and interterminal voltage) of the memory element 21C, before and after the operation of writing. It is to be noted that the word "interterminal" here means "between the electrodes 215A and 215B (between the semiconductor layers 212N and 213N)". It is found from this FIG. 10 that the memory element 21C before the operation of writing exhibits a characteristic in which almost no electric current flows between the terminals even when a voltage is applied between the terminals, but the operation of writing causes the memory element 21C to exhibit a resistive characteristic in which an electric current flows between the terminals in response to the application of the interterminal voltage.

Figure 11:
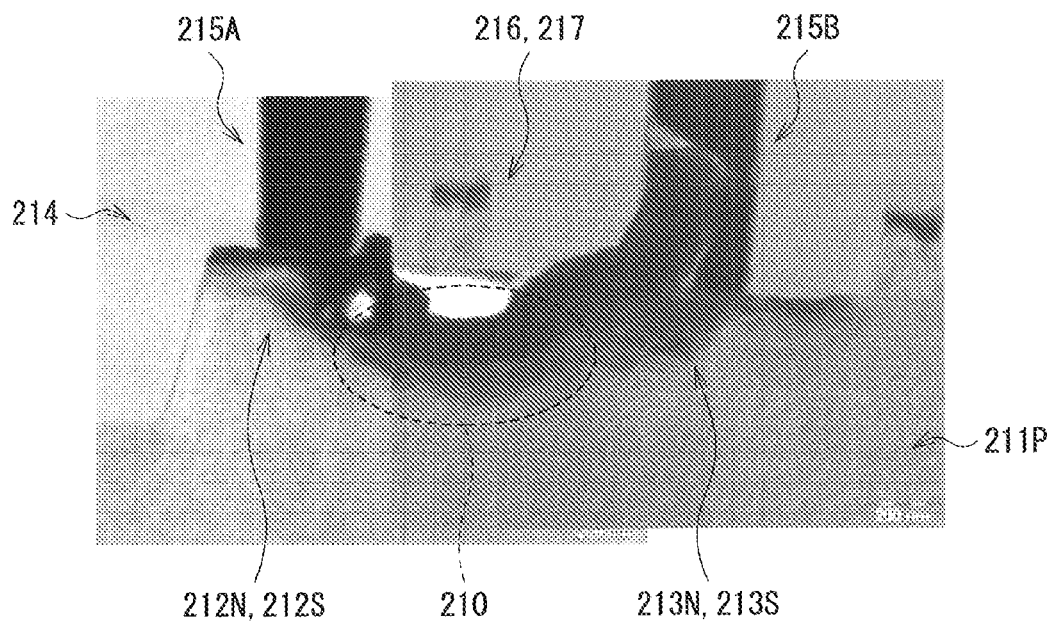
FIG. 11 is an illustration representing a cross-sectional photograph of a state after the operation of writing in the memory element according to the example.
Figure 12:
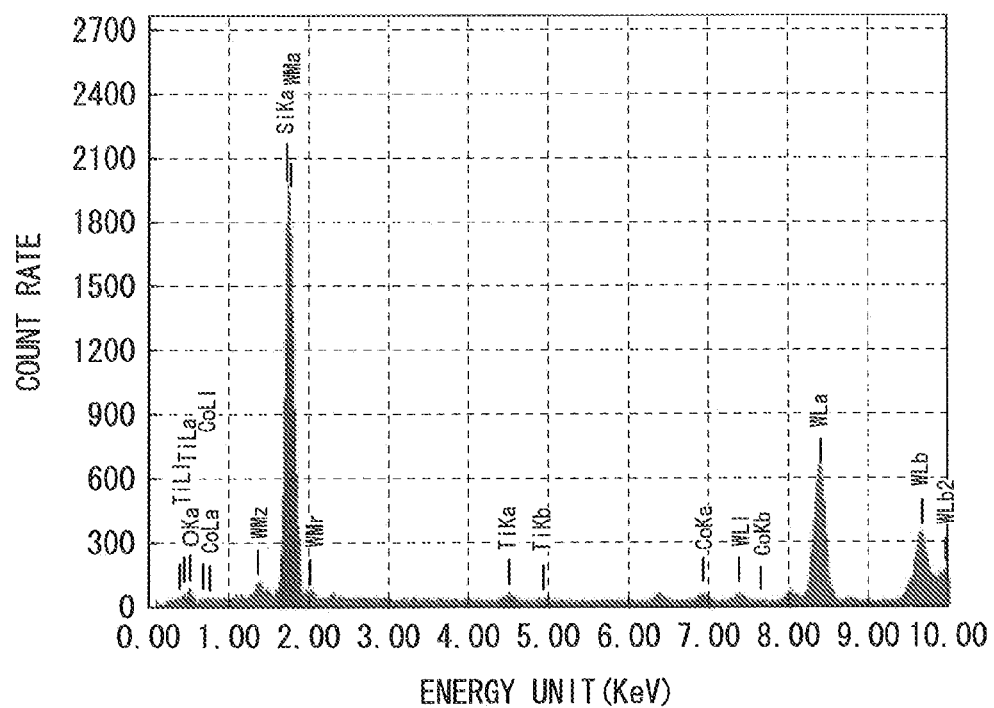
FIG. 12 is a characteristic diagram illustrating an example of an elemental analysis result in a region between electrodes of the memory element illustrated in FIG. 11.

Further, FIG. 11 illustrates an example of a cross-sectional photograph (a photograph taken by TEM: Transmission Electron Microscope) of a state after the operation of writing in the memory element 21C. From this FIG. 11, it is apparent that the filament 210 is formed between the semiconductor layers 212N and 213N by the operation of writing. Based on an example of an elemental analysis result (a result of analysis by EDX: Energy Dispersive X-ray spectrometry) in a region between the electrodes of the memory element 21C illustrated in FIG. 12, the following may be said. That is, one or more of the conductive component of the electrode 215A, the conductive component of the electrode 215B, and the conductive component of the silicide layers 212S and 213S are detected between the semiconductor layers 212N and 213N after the operation of writing. It is to be noted that here, as an example, elemental components of tungsten (W), titanium (Ti), and cobalt (Co) are detected in peak waveforms illustrated in FIG. 12. As a result, there was actually confirmed the fact that the conductive component of the member mentioned above was moved into the semiconductor layer 211P by the migration and thereby the filament 210 was formed.

(Modifications of Second Embodiment)

Next, modifications (modifications 2 and 3) of the second embodiment will be described. It is to be noted that the same elements as those in the second embodiment will be provided with the same reference characters as those in the second embodiment, and the description will be omitted as appropriate.

[Modification 2]

Figure 13:
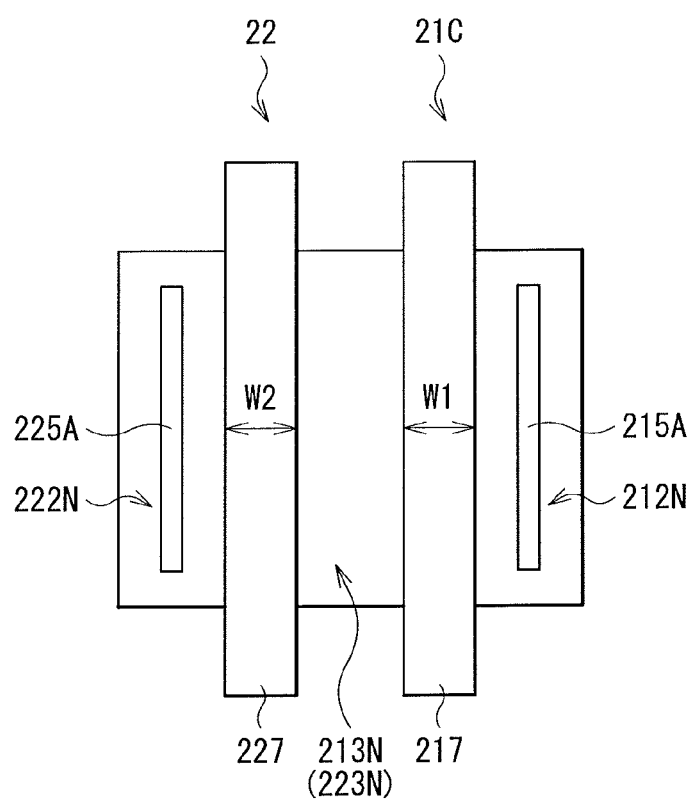
FIG. 13 is a schematic plan view illustrating an example of an outline configuration of a memory element and a selection transistor according to a modification 2.
Figure 14A:
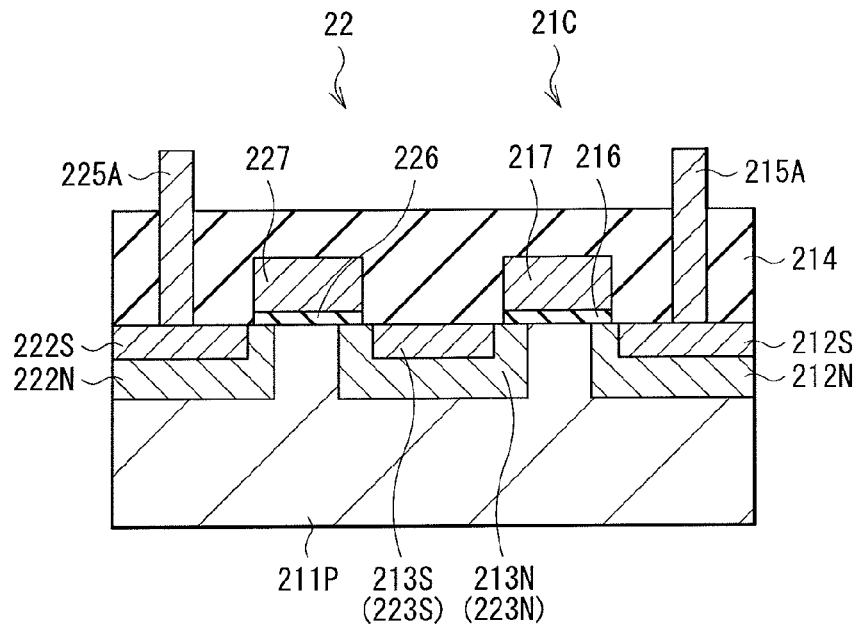
FIGS. 14A and 14B are schematic cross-sectional diagrams each illustrating a configurational example of the memory element and the selection transistor (before and after operation of writing) illustrated in FIG. 13.
Figure 14B:
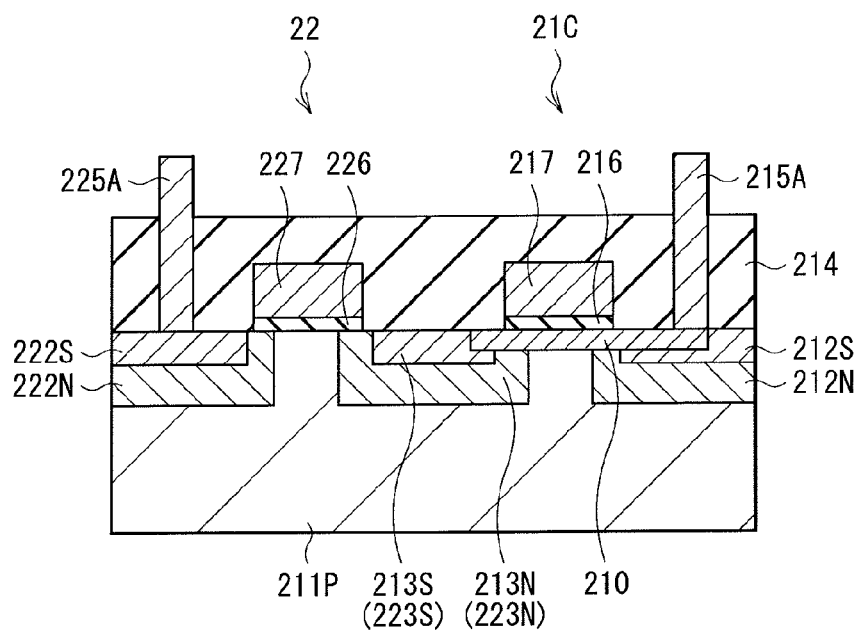

FIG. 13 schematically illustrates an example of a plane configuration of a memory element 21C and a selection transistor 22 according to the modification 2. Further, FIGS. 14A and 14B each schematically illustrate an example of a cross-sectional configuration of the memory element 21C and the selection transistor 22, and illustrate the example of the cross-sectional configuration before operation of writing and the example of the cross-sectional configuration after the operation of writing, respectively. In the present modification, as will be described below, the memory element 21C and the selection transistor 22 are formed integrally in the same activated region (an active region) in a memory cell 20B.

Specifically, here, three N-type semiconductor layers 212N, and 213N (223N), and 222N are formed in a P-type semiconductor layer 211P. Further, silicide layers 212S, 213S, and 222S are formed in these semiconductor layers 212N, 213N (223N), and 222N, respectively. In a region corresponding to a part between the semiconductor layers 212N and 213N on the semiconductor layer 211P, the dielectric film 216 and the conductive film 217 described above are formed in this order. Furthermore, likewise, in a region corresponding to a part between the semiconductor layers 213N and 222N on the semiconductor layer 211P, a dielectric film 226 and a conductive film 227 corresponding to a gate insulator and a gate electrode of the selection transistor 22 are formed in this order. On the semiconductor layer 212N (and the silicide layer 212S), an electrode 215A electrically connected thereto is formed, and on the semiconductor layer 222N (and the silicide layer 222S), an electrode 225A electrically connected thereto is formed. In this way, in the memory element 21C and the selection transistor 22 of the present modification, because of the integral formation in the activated region, the gates thereof (the conductive films 217 and 227) are disposed in parallel. In other words, in the memory element 21C and the selection transistor 22, the dielectric films 216 and 226 as well as the conductive films 217 and 227 have structures in common (the same structures). In addition, although not illustrated here, the structures of the memory element 21C and the selection transistor 22 are also common with (identical to) the structures of other MOS transistors within a circuit in the memory device 1.

It is to be noted that W1 illustrated in FIG. 13 represents the width of the conductive film 217, and W2 represents the width (corresponding to a gate length L of the selection transistor 22) of the conductive film 227 (here, a direction in which an electric current flows is defined as the width of the conductive film). In this case likewise, as described above, it may be said that the width W1 of the conductive film 217 in the memory element 21C is desirably smaller than the width W2 (the gate length L) of the conductive film 227 in the selection transistor 22.

In this way, in the present modification, the memory element 21C and the selection transistor 22 are integrally formed in the same activated region and thereby the gates thereof are disposed in parallel, and therefore, it is possible to obtain the following effect in addition to the effects in the second embodiment. That is, the memory cell 20B including the selection transistor 22 and the memory element 21C may be realized as having an area substantially as small as a MOS transistor having two gates, and in particular, even when the bit count is large, a peripheral circuit having a small area may be implemented.

It is to be noted that in the present modification, there has been described the case in which the memory element 21C and the selection transistor 22 are formed integrally in the same activated region. However, for example, the earlier-described memory element 21B and the selection transistor 22 may be formed integrally in the same activated region.

[Modification 3]

Figure 15:
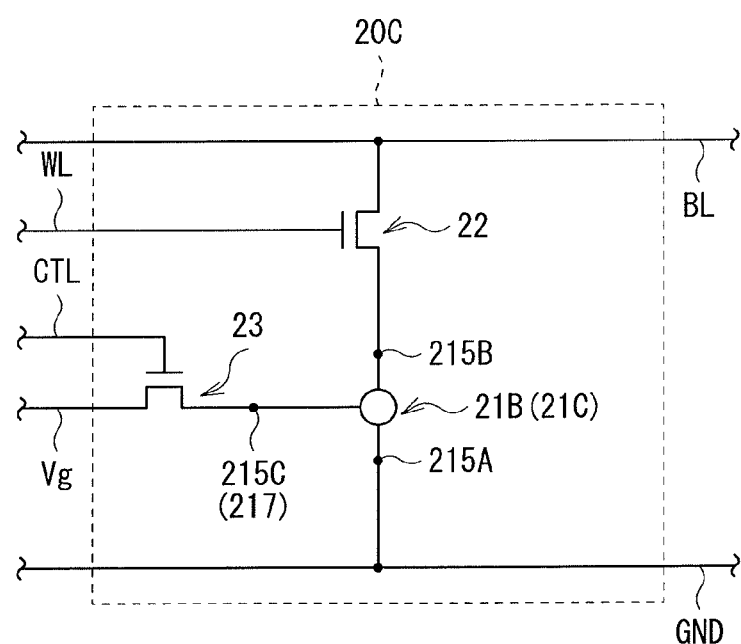
FIG. 15 is a circuit diagram illustrating a configurational example of a memory cell according to a modification 3.

FIG. 15 illustrates an example of a circuit configuration of a memory cell (a memory cell 20C) according to the modification 3. The memory cell 20C of the present modification has one memory element 21B (or a memory element 21C), one selection transistor 22, and one control transistor 23. In other words, this memory cell 20C is formed by further providing the control transistor 23 to be described below in the memory cell 20B of the second embodiment, and is otherwise similar in configuration to the memory cell 20B.

The control transistor 23 is a transistor controlling a conductive film potential (for example, an electric potential of an electrode 215C illustrated in the figure) of the memory element 21B (or the memory element 21C), and is configured by using a MOS transistor here. In this control transistor 23, a gate is connected to a predetermined control signal line CTL, and one of a source and a drain is connected to an electrode 215C electrically connected to a conductive film 217 in the memory element 21B (or the memory element 21C). Further, the other of the source and the drain in the control transistor 23 is set at a predetermined electric potential (a gate potential Vg).

In the memory cell 20C of the present modification, at the time of operation of writing, the control transistor 23 is made to be in an OFF state through the control by the control signal line CTL, and thereby the conductive film 217 in the memory element 21B (or the memory element 21C) targeted for the operation of writing is set to be in a no-voltage-applied state (a floating state). However, when this control transistor 23 is in the OFF state, the conductive film 217 may not be set in the floating state, and may be set to have a predetermined electric potential to be applied thereto. On the other hand, at the time other than the operation of writing, the control transistor 23 is made to be in an ON state through the control by the control signal line CTL, and thereby the conductive film 217 is set at the predetermined gate potential Vg (here, equivalent to an OFF-state voltage when the memory element 21B or the memory element 21C is seen as a MOS transistor). It is to be noted that "the time other than the operation of writing" mentioned here does not include the time when a circuit of a memory device is not in operation (the time when neither operation of reading nor operation of writing is performed for the memory element).

Therefore, in the present modification, it is possible to avoid the following disadvantage that results from the gate of the memory element 21B (or the memory element 21C) entering the floating state even at the time other than the operation of writing. In other words, first, when some kind of electric charge is accumulated at the gate in the floating state with no escape for electric charge, due to a hot carrier phenomenon or the like, the memory element 21B (or the memory element 21C) is constantly in the ON state, like a MONOS (Metal-Oxide-Nitride-Oxide-Silicon)-type memory element (memory transistor). As a result, in the present modification, it is possible to avoid misrecognition of a memory element in a non-writing state as a memory element in a writing state.

(Other Modifications)

Up to this point, the present technology has been described by using the embodiments and modifications, but the present technology is not limited to these embodiments and the like, and may be variously modified.

For example, there is no limitation to the material of each layer described in the embodiments and the like, and other materials may be employed. Further, in the embodiments and the like, the configurations of the memory elements, memory cells, and memory devices have been described specifically, but all the layers may not be provided, and other layers may be further provided.

Furthermore, in each of the embodiments and the like, there has been described the case in which between the bit line BL and the ground GND, the selection transistor 22 on the bit line BL side, and any of the memory elements 21 and 21A to 21C on the ground GND side are connected to each other in series, but the circuit configuration of the memory cell is not limited to this case. In other words, the selection transistor 22 on the ground GND side and any of the memory elements 21 and 21A to 21C on the bit line BL side may be connected to each other in series.

Moreover, in each of the embodiments and the like, there has been described the case in which the semiconductor layer 211P is a P-type semiconductor layer and the semiconductor layers 212N, 213N, 222N, and 223N are N-type semiconductor layers. However, the conductivity types (P-type and N-type) in these semiconductor layers may be reversed.

In addition, in each of the embodiments and the like, there has been described the case in which more than one memory element is provided in the memory device, but only one memory element may be provided, without being limited to this case.

Further, in each of the embodiments and the like, the memory device has been described as an example of the semiconductor device of the present technology. However, the semiconductor device may be configured by using a semiconductor integrated circuit also including other elements (for example, a transistor, a capacitor, a resistance element, and the like) in addition to such a memory device.

The present disclosure contains subject matter related to that disclosed in Japanese Priority Patent Application JP 2011-34797 filed in the Japan Patent Office on Feb. 21, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An operation method of a semiconductor device, the method comprising:
providing one or more memory elements each including (a) a first semiconductor layer of a first conductivity type, (b) second and third semiconductor layers of a second conductivity type, which are disposed to be separated from each other in the first semiconductor layer, (c) a first electrode electrically connected to the second semiconductor layer, and (d) a second electrode electrically connected to the third semiconductor layer; and
performing an operation of writing information on a memory element to be driven of the one or more memory elements, wherein,
the operation of writing is performed by forming a filament in a region between the second and third semiconductor layers, which is a conductive path electrically linking these semiconductor layers, through application of a voltage equal to or higher than a predetermined threshold between the first electrode and the second electrode.

2. The operation method according to claim 1, wherein:
the memory element has a dielectric film and a conductive film in this order, in a region corresponding to a part between the second and third semiconductor layers, on the first semiconductor layer, and
the operation of writing is performed by applying the voltage equal to or higher than the threshold between the first electrode and the second electrode, while setting the conductive film in the memory element to be driven in a no-voltage-applied state.

3. The operation method according to claim 2, wherein:
at a time other than the operation of writing, a predetermined control transistor is made to be in an ON state, thereby setting the conductive film in the memory element to be driven at a predetermined potential, and
meanwhile, at a time of the operation of writing, the control transistor is set to be in an OFF state.

4. The operation method according to claim 1, wherein at least one of a conductive component of the first electrode and a conductive component of the second electrode is moved by migration, and thereby the filament is formed.

5. The operation method according to claim 1, wherein:
in the memory element in which the operation of writing is not performed, the second and third semiconductor layers are in an open state of being electrically separated from each other, and
meanwhile, in the memory element after the operation of writing is performed, the second and third semiconductor layers are in a state of being electrically connected to each other by a resistance component, due to formation of the filament.

6. The operation method according to claim 1, wherein:
one memory element and one selection transistor are provided to be connected to each other in series, between a bit line to apply the voltage equal to or higher than the threshold and a ground, and
the operation of writing is performed after the memory element to be driven is selected by making the selection transistor be in an ON state.

7. The operation method according to claim 6, wherein the memory element and the selection transistor are formed integrally in the same activated region.

8. The operation method according to claim 1, wherein a silicide layer is provided in each of the second and third semiconductor layers.

9. The operation method according to claim 8, wherein one or more of a conductive component of the first electrode, a conductive component of the second electrode, and a conductive component of the silicide layer are moved by migration, and thereby the filament is formed.

10. A semiconductor device comprising:
one or more memory elements each including (a) a first semiconductor layer of a first conductivity type, (b) second and third semiconductor layers of a second conductivity type, which are disposed to be separated from each other in the first semiconductor layer, (c) a first electrode electrically connected to the second semiconductor layer, and (d) a second electrode electrically connected to the third semiconductor layer; and
a drive section configured to perform an operation of writing information, by forming a filament in a region between the second and third semiconductor layers, which is a conductive path electrically linking these semiconductor layers, through application of a voltage equal to or higher than a predetermined threshold between the first electrode and the second electrode, in a memory element to be driven, of the one or more memory elements.

11. The semiconductor device according to claim 10, wherein the memory element has a dielectric film and a conductive film in this order, in a region corresponding to a part between the second and third semiconductor layers, on the first semiconductor layer.

12. The semiconductor device according to claim 11, wherein the drive section performs the operation of writing, by applying the voltage equal to or higher than the threshold between the first electrode and the second electrode, while setting the conductive film in the memory element to be driven in a no-voltage-applied state.

13. The semiconductor device according to claim 10, further comprising a selection transistor to select a memory element to be driven from the one or more memory elements,
wherein the memory element and the selection transistor are formed integrally in the same activated region.

* * * * *